(12) United States Patent
Hsu et al.

(10) Patent No.: US 8,212,349 B2
(45) Date of Patent: Jul. 3, 2012

(54) SEMICONDUCTOR PACKAGE HAVING CHIP USING COPPER PROCESS

(75) Inventors: Hung-Hsin Hsu, Hsinchu (TW); Chin-Ming Hsu, Hsinchu (TW); Jui-Ching Hsu, Hsinchu (TW)

(73) Assignee: Powertech Technology Inc., Hukou Shiang, Hsinchu (TW)

( * ) Notice: Subject to any disclaimer, the term of this patent is extended or adjusted under 35 U.S.C. 154(b) by 133 days.

(21) Appl. No.: 12/649,092

(22) Filed: Dec. 29, 2009

(65) Prior Publication Data

US 2011/0156238 A1 Jun. 30, 2011

(51) Int. Cl.
*H01L 23/49* (2006.01)
*H01L 23/498* (2006.01)

(52) U.S. Cl. ............... 257/692; 257/751; 257/E23.025; 257/E23.072

(58) Field of Classification Search .................. 257/692, 257/751, E23.025, E23.072
See application file for complete search history.

(56) References Cited

U.S. PATENT DOCUMENTS

| 5,086,337 | A  | * | 2/1992 | Noro et al. ............... 257/726 |
| 7,375,032 | B2 | * | 5/2008 | Seliger et al. ............. 438/695 |
| 7,626,274 | B2 | * | 12/2009 | Amagai ..................... 257/779 |
| 7,816,255 | B2 | * | 10/2010 | Choi et al. ................ 438/627 |
| 2006/0017171 | A1 | * | 1/2006 | Weng ........................ 257/766 |

* cited by examiner

*Primary Examiner* — Matthew W Such
*Assistant Examiner* — Monica D Harrison
(74) *Attorney, Agent, or Firm* — Muncy, Geissler, Olds & Lowe, PLLC

(57) ABSTRACT

A semiconductor package having chip using copper process is revealed. A chip using copper process is disposed on a substrate. The substrate has a core layer, a copper circuitry with connecting pads, a patterned diffusion barrier, and a solder mask. The copper circuitry is formed on the core layer. The patterned diffusion barrier has such a pattern identical to the one of the copper circuitry that an upper surface of the copper circuitry is completely covered. The substrate further has a bonding layer formed on a portion of the patterned diffusion barrier inside the solder mask's opening. Therefore, diffusion of copper ions from the copper circuitry of the substrate to the active surface of the chip can be avoided to prevent function failure of the chip.

10 Claims, 4 Drawing Sheets

SEMICONDUCTOR PACKAGE HAVING CHIP USING COPPER PROCESS

FIELD OF THE INVENTION

The present invention relates to a packaged semiconductor device, and more particularly to a semiconductor package including chip(s) using copper processes.

BACKGROUND OF THE INVENTION

Semiconductor devices are always developing toward smaller feature sizes with higher densities of circuitry. When feature size is below 0.25 um, RC delay caused by the resistivity of metal traces and the parasitic capacitance of dielectric becomes the major key factor impacting the operation speed of semiconductor devices. Therefore, semiconductor industries have implemented copper traces in chips to replace the conventional Al/W or Al/Cu traces when feature sizes are below 0.13 um to increase the operation frequency of semiconductor devices so that copper processes have become the mainstream of multiple metal layers of high-end IC technology in the world. Since copper is an active metal, any copper ion from chips or substrates becomes the killing contaminant to the performance of Si materials and other dielectric materials. Once the semiconductor layers of Si chips are penetrated and contaminated by copper ions, the life cycles of minor carriers are shortened and the leakage current of devices increases. Furthermore, when copper ions penetrate into internal dielectric layer of IC chips, the breakdown electric fields are decreased with the increase of leakage current.

In the conventional chip packages, not only chips have copper circuitry but also substrates have many copper circuitry in different layers where normally a gold layer is disposed on the I/O pads of copper traces in substrates to prevent copper oxidation and to enhance electrical connections so that bonding wires can be used as electrical connection between chips and substrates. A barrier layer is formed between the gold layer and the copper circuitry to avoid inter-metallic diffusion between the gold layer and the copper layer. However, the barrier layer in substrate is only formed under I/O connecting pads and is very localized with a very thin thickness which can not effectively stop copper ions diffusing from the copper circuitry to the semiconductor layers of chips. Moreover, the copper ions of the chips also diffuse to the semiconductor layers leading to function failure of the chips, especially a lower chip disposed between an upper chip and the substrate which is more subject to function failure issues in the stacked package having chips using copper process.

SUMMARY OF THE INVENTION

The main purpose of the present invention is to provide a semiconductor package having chip using copper process to prevent copper ions (Cu ions) diffusing from copper circuitry of substrates to the active surfaces of chips to avoid function failure of chips.

The second purpose of the present invention is to provide a semiconductor package having chip using copper process to prevent copper ions diffusion and contamination of interposer chip in multi-chip stacked package to enhance product reliability.

According to the present invention, a semiconductor package having chip using copper process primarily comprises a substrate, a first chip using copper process, and a first electrical connecting component. The substrate has a core layer, a copper circuitry including at least a connecting pad, a patterned diffusion barrier on the copper circuitry, and a solder mask, wherein the copper circuitry is formed on the core layer and the patterned diffusion barrier has such a pattern identical to the copper circuitry that an upper surface of the copper circuitry is completely covered. The solder mask covers the patterned diffusion barrier and the core layer and has an opening to expose a portion of the patterned diffusion barrier on the connecting pad. The substrate further has a bonding layer formed on the portion of the patterned diffusion barrier inside the opening. The first chip is disposed on the substrate, and the first chip has a first copper pad. The first electrical connecting component connects the first copper pad to the bonding layer. The first chip described in the above semiconductor package is also revealed in the present invention.

A semiconductor package having chip using copper process and the chips according to the present invention has the following advantages and functions:

1. Through the identical patterns between the patterned diffusion barrier and the copper circuitry of the substrate as a technical mean, the patterned diffusion barrier can completely cover the upper surface of the copper circuitry to prevent copper ions diffusing from the copper circuitry of the substrate to the active surface or semiconductor layer of the chip to avoid function failure of chip using copper process, especially to avoid function failure of the chip stacked in the middle of an multi-chip stacked package.

2. Through the disposition the barrier layer completely covering the backside of the semiconductor layer of a chip using copper process as a technical mean, the diffusion and contamination of copper ions between stacked chips can effectively be avoided to enhance product reliability.

3. Through complete coverage of the patterned diffusion barrier on the upper surface of the copper circuitry as a technical mean, the patterned diffusion barrier can serve as an etching mask during the formation of copper circuitry so that the copper circuitry does not extend to the edges of the core layer, i.e., the conventional plating lines can be eliminated and the cut ends of the conventional plating lines exposed from the edges of the core layer can be avoided to prevent electrical static discharging.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
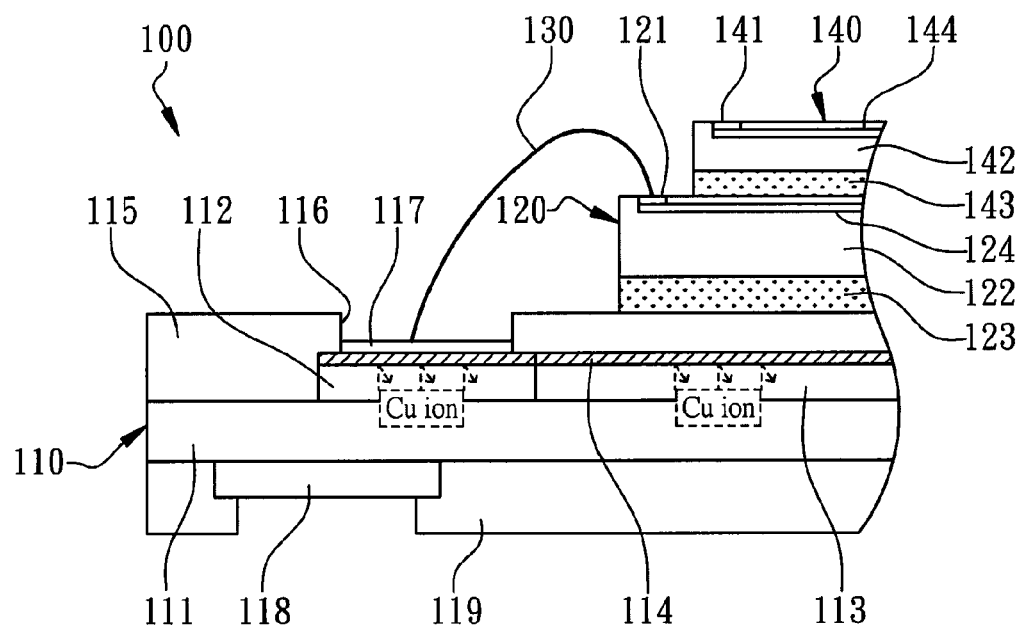
FIG. 1 is a partial cross-sectional view of a semiconductor package having chip using copper process before encapsulation according to the first embodiment of the present invention.
Figure 2:
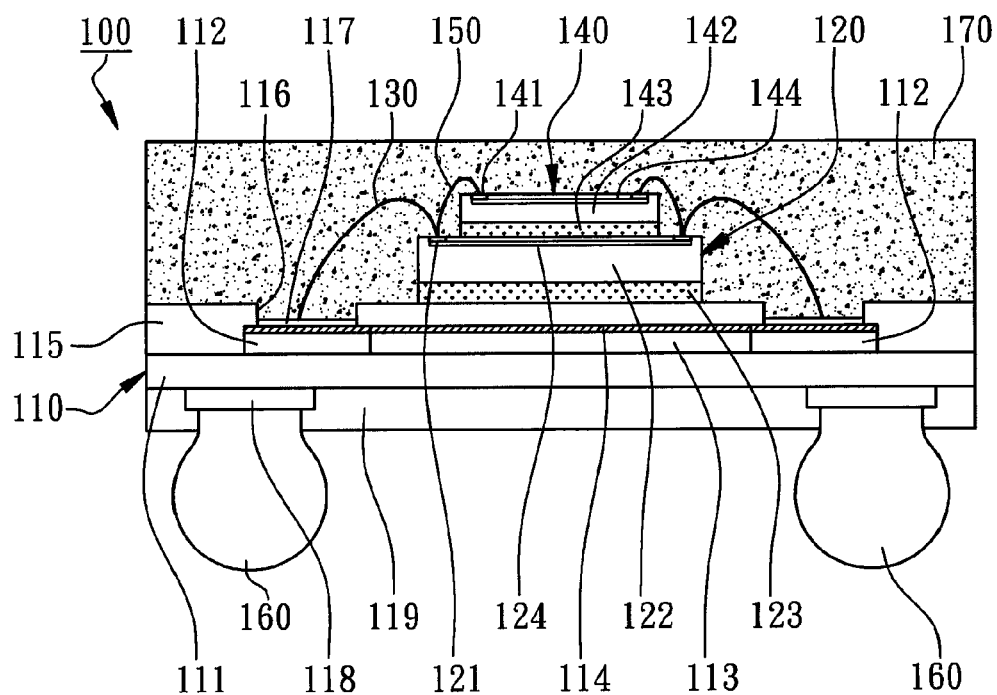
FIG. 2 is a cross-sectional view of the semiconductor package according to the first embodiment of the present invention.

According to the first embodiment of the present invention, a semiconductor package having chip using copper process is illustrated in FIG. 1 for a partial cross-sectional view before encapsulation and in FIG. 2 for a cross-sectional view. The semiconductor package 100 primarily comprises a substrate 110, a first chip 120 using copper process, and a first electrical connecting component 130.

The substrate 110 has a core layer 111, a copper circuitry 113 including at least a connecting pad 112, a patterned diffusion barrier 114, and a solder mask 115. The substrate 110 is a chip carrier for electrical connections to the chip 120. The core layer 111 is the major structure of the substrate 110 made of glass fiber enforced resin which can be chosen from epoxy resin, PI (Polyimide), BT (Bismaleimide Trazine) resin, FR4 resin, etc.

The copper circuitry 113 is formed on the core layer 111 where the copper circuitry 113 further includes a plurality of conductive traces formed by etching a copper foil where the copper foil went through PCB manufacture processes of dry film coating, exposing, and developing to form the conductive traces with the connecting pad 112. In this embodiment, each conductive trace has a corresponding connecting pad 112 as shown in FIG. 4.

Figure 4:
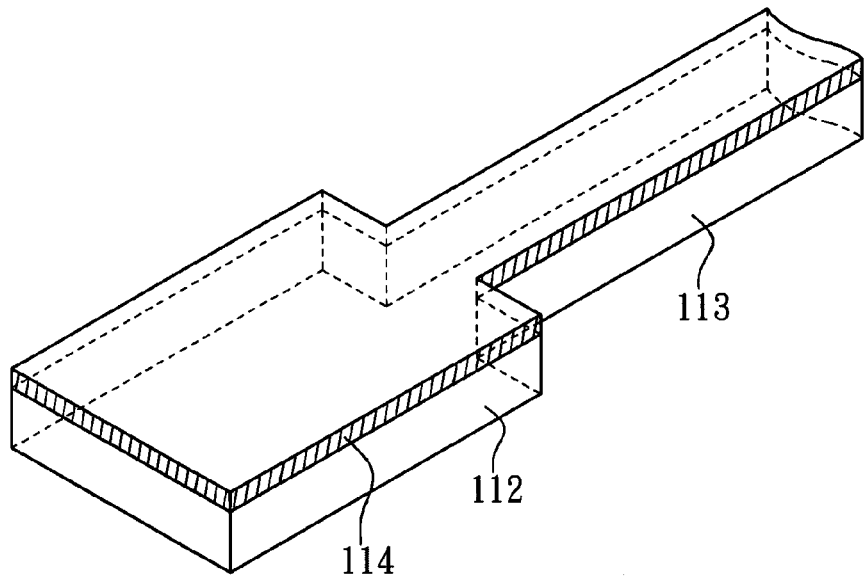
FIG. 4 is a partial 3D view of the patterned diffusion barrier and the copper circuitry on substrate of the semiconductor package according to the first embodiment of the present invention.

As shown in FIG. 4, the patterned diffusion barrier 114 has such a pattern identical to the copper circuitry 113 that an upper surface of the copper circuitry 113 is completely covered to protect the copper circuitry 113 from oxidation and to avoid copper ions diffusing from the copper circuitry 113 to the first chip 120 to prevent function failure of the first chip 120. Especially, the patterned diffusion barrier 114 is formed between the copper circuitry 113 and the first chip 120 to avoid the copper ions (Cu ions) diffusing from the conductive traces of the copper circuitry 113 to the first semiconductor layer 122 of the first chip 120 (as shown in FIG. 1). Preferably, the material of the patterned diffusion barrier 114 can be nickel (Ni) with excellent blocking capability to prevent diffusion of copper ions where the thickness of the patterned diffusion barrier 114 ranges from 1 um to 20 um.

The solder mask 115 covers the patterned diffusion barrier 114 and the core layer 111. The solder mask 115 has an opening 116 to expose a portion of the patterned diffusion barrier 114 on the connecting pad 112. The substrate 110 further has a bonding layer 117 formed on the portion of the patterned diffusion barrier 114 inside the opening 116. The portion of the patterned diffusion barrier 114 is aligned with the connecting pad 112. Preferably, the bonding layer 117 can be gold to enhance reliable electrical connections between the substrate 110 and the first chip 120 during wire bonding processes.

To be more specific, as shown in FIG. 2, the substrate 110 further has a plurality of external pads 118 and another solder mask 119 where the external pads 118 are formed on the bottom surface of the core layer 111 and exposed from the solder mask 119 for disposing a plurality of solder balls 160. The external pads 118 are electrically connected to the corresponding connecting pads 112 through internal circuitry of the substrate 110. The solder balls 160 are used for external electrical connections to a printed circuit board (PCB) or to another semiconductor package. The materials of the external pads 118 can be copper. The substrate 110 is a laminated printed circuit board with a doubt-side circuitry structure.

In detail, the solder masks 115 and 119 are individually disposed on the top and bottom surfaces of the substrate 110 to form a protection layer to protect the conductive traces from moisture and contaminant from the environment. The solder masks 115 and 119 are also known as solder resist composed by epoxy resin and photosensitive resin. The colors of the solder mask 115 and 119 are not limited to green which also can be black, red, blue, or other colors.

As shown in FIG. 1, the first chip 120 is disposed on the substrate 110, and the first chip 120 has a first copper pad 121. The ICs disposed on the first chip 120 are fabricated by copper processes where the first copper pads 121 can be arranged in a single-row or multiple rows on the peripheries of the active surface of the first chip 120 which are interconnected by copper circuitry 124 as the external electrical connections for the ICs inside the first chip 120. In the present embodiment, the first chip 120 can be a memory chip such as SDRAM or DDR DRAM. The first chip 120 essentially consists of a first semiconductor layer 122 and a first adhesion layer 123. The materials of the first semiconductor layer 122 can be Si, GaAs, or other semiconductor materials with an appropriate thickness through backside grinding, i.e., the first semiconductor layer 122 is ground to an appropriate thickness, then the first adhesive layer 123 is attached to the ground backside of the first semiconductor layer 122 by stencil printing, dispensing, or tape attaching. The materials of the first adhesive layer 123 can be resin, B-stage paste, film, epoxy, non-conductive paste, or liquid paste. The back surface of the first chip 120 is then attached to the substrate 110 by the first adhesive layer 123.

As shown in FIG. 1, the first electrical connecting component 130 electrically connects the first copper pad 121 to the bonding layer 117 where the first electrical connecting component 113 may be a bonding wire formed by wire bonding processes. Preferably, the materials of the first electrical connecting component 130 and the bonding layer 117 are gold to achieve excellent bonding strengths. Furthermore, copper wires with better electrical conductivity can also be used as the electrical connecting component 113.

As shown in FIG. 2, the semiconductor package 100 further comprises a second chip 140 using copper process and at least a second electrical connecting component 150 where the second chip 140 using copper process is disposed on the first chip 120. The second chip 140 using copper process has at least a second copper pad 141 where the second copper pad 141 is electrically connected to the copper circuitry 144. The second electrical connecting component 150 electrically connects the second copper pad 141 to the first copper pad 121 or the bonding layer. To be more specific, the second chip 140 using copper process essentially consists of a second semiconductor layer 142 and a second adhesive layer 143. The structure of the second chip 140 using copper process is the same as the one of the first chip 120 which will not be described in detail hereafter. In other embodiments, more chips can be stacked on the second chip 140 using copper process to achieve more capacity or more functions.

As shown in FIG. 2, the semiconductor package 100 further comprises an encapsulant 170 formed by molding or dispensing, such as is an epoxy molding compound (EMC), to encapsulate the chips 120 and 140 using copper process and the electrical connecting components 130, 150 to provide appropriate protection from electrical short and from environmental contamination.

As shown from FIG. 3A to FIG. 3E, the fabrication method of the patterned diffusion barrier 114 and the copper circuitry 113 is further described in detail but not limited to demonstrate the feasibility and the effective functions of the present invention.

Figure 3A:
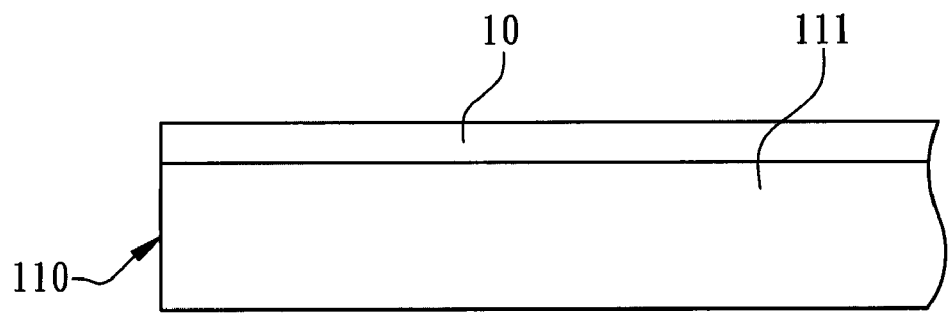
FIG. 3A to FIG. 3E are cross-sectional views of components of the semiconductor package to illustrate the formation process of its patterned diffusion barrier according to the first embodiment of the present invention.
Figure 3B:
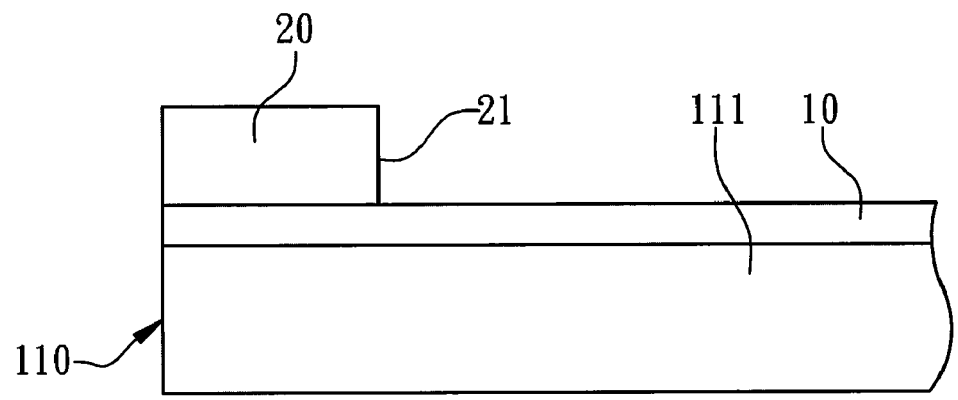
Figure 3C:
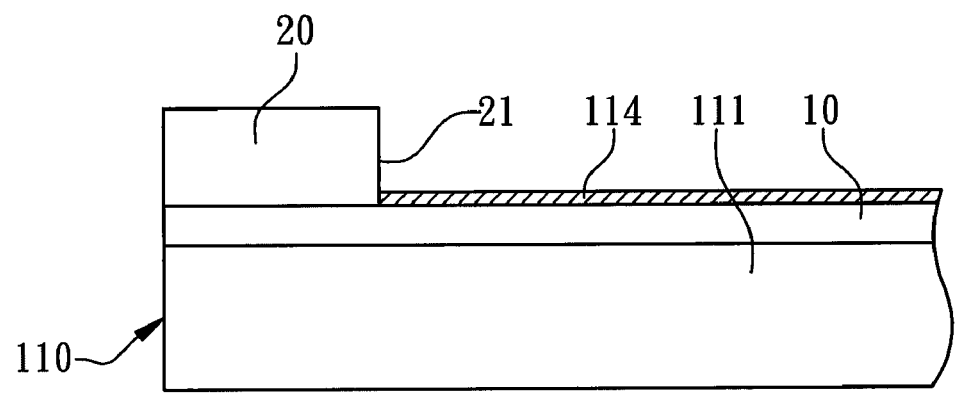
Figure 3D:
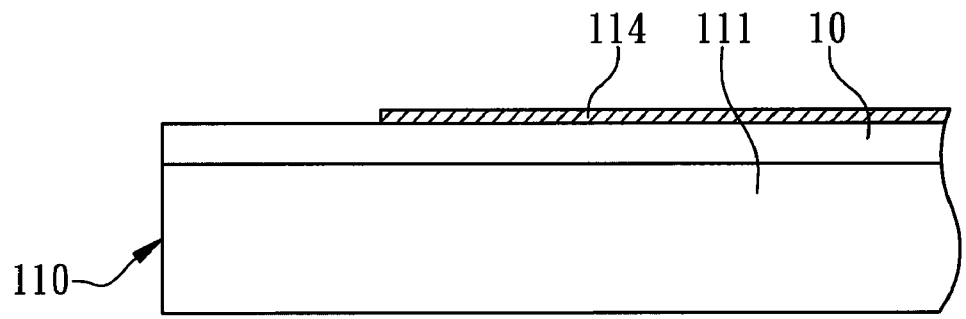
Figure 3E:
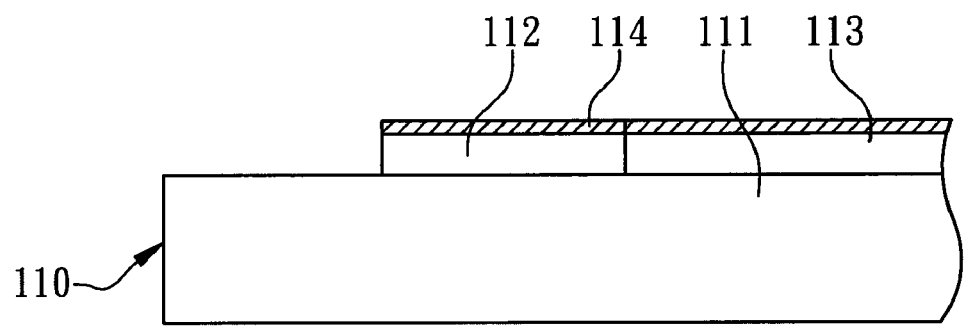

Firstly, as shown in FIG. 3A, a core layer 111 of the predescribed substrate 110 is provided where a copper foil 10 is formed on the top surface of the core layer 111. Then, as shown in FIG. 3B, a photo resist 20 is formed on the copper foil 10 and then to form a plurality of openings 21 by exposing and developing processes where the openings 21 are the predefined formation area of the patterned diffusion barrier 114. Preferably, the photo resist 20 is a dry film. Then, as shown in FIG. 3C, the patterned diffusion barrier 114 is disposed inside the openings 21 which is predefined as a circuitry mask on the copper foil 20 by electroplating. Then, as shown in FIG. 3D, the photo resist 20 is removed by photo resist striping processes. As shown from FIG. 3D to FIG. 3E, the exposed portion of the copper foil 10 which is not covered by the patterned diffusion barrier 114 is then etched away to form the copper circuitry 113 with the connecting pad 112. Therefore, as shown in FIG. 4, the pattern of the patterned diffusion barrier 114 has such a pattern identical to the copper circuitry 113 that an upper surface of the copper circuitry 113 is completely covered. To be more specific, as shown in FIG. 3D and FIG. 3E again, the patterned diffusion barrier 114 can be served as an etching mask during etching the copper foil 10 to be the copper circuitry 113 and further to prevent copper circuitry 113 extending to the edges of the core layer 111, i.e., the conventional plating lines can be eliminated and the cross-section of the conventional plating lines exposed from the edges of the core layer can be avoided to prevent electrical static discharging. Therefore, there is no need to design and manufacture plating lines according to the present invention to increase the layout density of the substrate and to avoid EMI and cross talk due to the extended plating lines.

Figure 5:
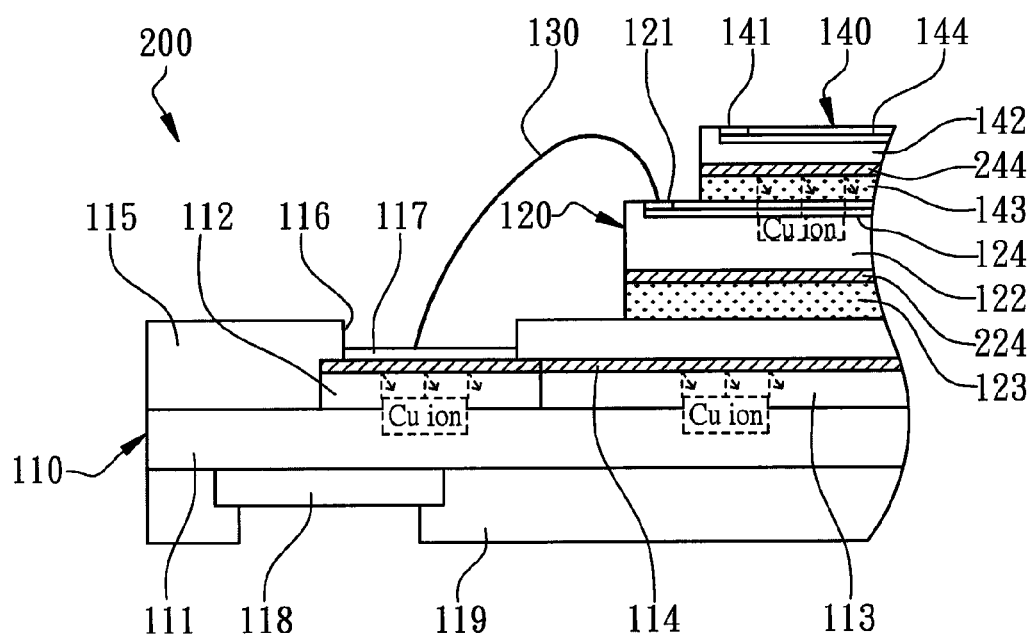
FIG. 5 is a partial cross-sectional view of another semiconductor package having chip using copper process before encapsulation according to the second embodiment of the present invention.

According to the second embodiment of the present invention, another semiconductor package having chip using copper process is illustrate in FIG. 5 for a partial cross-sectional view. The semiconductor package 200 primarily comprises a substrate 110, a first chip using copper process 120, and at least a first electrical connecting component 130 where the components and the corresponding described numbers are the same as in the first embodiment with the same functions which will not be described in detail again.

In the present embodiment, the first chip 120 further includes a first barrier layer 224 disposed between the first semiconductor layer 122 and the first adhesive layer 123 to completely cover the backside of the first semiconductor layer 122. The first adhesive layer 123 is attached to the first barrier layer 224. The second chip 140 using copper process further includes a second barrier layer 244 disposed between the second semiconductor layer 142 and the second adhesive layer 143 to completely cover the backside of the second semiconductor layer 142.

To be more specific, preferable, the materials of the first barrier layer 224 and the second barrier layer 244 are nickel (Ni) which can be formed by wafer-level sputtering, i.e., the back surface of the copper wafer is ground to an appropriate thickness, followed by sputtering the diffusion barriers 224 and 244 on the back surfaces of the copper wafer in wafer forms, and finally, the copper wafer is diced into a plurality of individual chips where the adhesive layers 123 and 143 can be formed before or after dicing. In the present embodiment, the second semiconductor layer 142 is a thinned chip through backside grinding. The second chip 140 using copper process may be smaller than the first chip 120. In other embodiments, the first chip 120 and the second chip 140 using copper process can be identical chips with the same dimensions, functions, and structures which can be fabricated in the same wafer.

Through the disposition and complete coverage of the patterned diffusion barrier 244 on the back surface of the second semiconductor layer 142 of the second chip 140 using copper process in a multi-chips stacked package, copper ions diffused from the first copper pad 121 and the copper circuitry 124 on the active surface of the first chip 120 can effectively be blocked by the second barrier layer 224 and the first barrier layer 224 (or the patterned diffusion barrier 114) and to be constrained within the first chip 120. The copper ions diffused from the second copper pad 141 and the copper circuitry 144 on the active surface of the second chip 140 using copper process can effectively be blocked by the second barrier layer 224 to be constrained within the second chip 140 using copper process. The copper ions diffused from the copper circuitry 113 of the substrate 110 can effectively be blocked within the substrate 110 by the patterned diffusion barrier 114. Therefore, copper ion contamination between stacked chips in a multi-chip stacked package can effectively be avoided to enhance product reliability.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A semiconductor package having chip using copper process, comprising:
   a substrate having a core layer, a copper circuitry including at least a connecting pad, a patterned diffusion barrier on the copper circuitry, and a solder mask, wherein the copper circuitry is formed on the core layer, the patterned diffusion barrier has such a pattern identical to the copper circuitry that an upper surface of the copper circuitry is completely covered, wherein the solder mask covers the patterned diffusion barrier and the core layer and has an opening to expose a portion of the patterned diffusion barrier on the connecting pad, the substrate further has a bonding layer formed on the portion of the patterned diffusion barrier inside the opening;
   a first chip using copper process disposed on the substrate, the first chip having a first copper pad, the first chip including a first semiconductor layer, a first adhesive layer, and a first barrier layer, wherein the first barrier layer is disposed between the first semiconductor layer and the first adhesive layer to completely cover a backside of the first semiconductor layer; and
   a first electrical connecting component connecting the first copper pad to the bonding layer.

2. The semiconductor package as claimed in claim 1, wherein the patterned diffusion barrier is formed between the copper circuitry and the first chip.

3. The semiconductor package as claimed in claim 1, wherein the material of the patterned diffusion barrier is nickel (Ni).

4. The semiconductor package as claimed in claim 1, wherein the first electrical connecting component is a bonding wire formed by wire bonding.

5. The semiconductor package as claimed in claim 1, wherein the materials of the first electrical connecting component and the bonding layer are gold.

6. The semiconductor package as claimed in claim 1, wherein the patterned diffusion barrier is served as an etching mask to form the copper circuitry without extending to the edges of the core layer.

7. A semiconductor package having chip using copper process, comprising:
- a substrate having a core layer, a copper circuitry including at least a connecting pad, a patterned diffusion barrier on the copper circuitry, and a solder mask, wherein the copper circuitry is formed on the core layer, the patterned diffusion barrier has such a pattern identical to the copper circuitry that an upper surface of the copper circuitry is completely covered, wherein the solder mask covers the patterned diffusion barrier and the core layer and has an opening to expose a portion of the patterned diffusion barrier on the connecting pad, the substrate further has a bonding layer formed on the portion of the patterned diffusion barrier inside the opening;
- a first chip using copper process disposed on the substrate, the first chip having a first copper pad;
- a first electrical connecting component connecting the first copper pad to the bonding layer;
- a second chip using copper process disposed on the first chip where the second chip has at least a second copper pad; and
- at least a second electrical connecting component electrically connecting the second copper pad to the first copper pad or the bonding layer;
- wherein the second chip includes a second semiconductor layer, a second adhesive layer, and a second barrier layer, wherein the second barrier layer is disposed between the second semiconductor layer and the second adhesive layer to completely cover a backside of the second semiconductor layer.

8. The semiconductor package as claimed in claim 7, wherein the second barrier layer is formed by wafer-level sputtering.

9. The semiconductor package as claimed in claim 7, wherein the material of the second barrier layer is nickel (Ni).

10. The semiconductor package as claimed in claim 7, wherein the second semiconductor layer is a thinned chip through backside grinding.

* * * * *